United States Patent
Lundgren et al.

(10) Patent No.: US 8,863,049 B1
(45) Date of Patent: Oct. 14, 2014

(54) CONSTRAINING TRACES IN FORMAL VERIFICATION

(75) Inventors: Lars Lundgren, Gothenburg (SE); Ziyad Hanna, Haifa (IL); Chung-Wah Norris Ip, Cupertino, CA (US); Kathryn Drews Kranen, Menlo Park, CA (US); Lawrence Loh, Milpitas, CA (US)

(73) Assignee: Jasper Design Automation, Inc., Mountain View, CA (US)

(*) Notice: Subject to any disclaimer, the term of this patent is extended or adjusted under 35 U.S.C. 154(b) by 442 days.

(21) Appl. No.: 12/961,389

(22) Filed: Dec. 6, 2010

(51) Int. Cl.
*G06F 17/50* (2006.01)

(52) U.S. Cl.
USPC ............................................. 716/106

(58) Field of Classification Search
USPC ................................................ 716/106
See application file for complete search history.

(56) References Cited

U.S. PATENT DOCUMENTS

| | | | |
|---|---|---|---|
| 6,363,518 B1* | 3/2002 | Lee ............................... | 716/122 |
| 6,611,947 B1 | 8/2003 | Higgins et al. | |
| 6,993,730 B1 | 1/2006 | Higgins et al. | |
| 7,020,856 B2 | 3/2006 | Singhal et al. | |
| 7,065,726 B1 | 6/2006 | Singhal et al. | |
| 7,137,078 B2 | 11/2006 | Singhal et al. | |
| 7,159,198 B1 | 1/2007 | Ip et al. | |
| 7,237,208 B1 | 6/2007 | Ip et al. | |
| 7,412,674 B1 | 8/2008 | Singhal et al. | |
| 7,418,678 B1 | 8/2008 | Ip et al. | |
| 7,421,668 B1* | 9/2008 | Ip et al. ............................ | 716/108 |
| 7,437,694 B1 | 10/2008 | Loh et al. | |
| 7,506,288 B1 | 3/2009 | Ip et al. | |
| 7,647,572 B1 | 1/2010 | Ip et al. | |
| 7,895,552 B1 | 2/2011 | Singhal et al. | |
| 8,103,999 B1 | 1/2012 | Martensson | |
| 8,131,768 B2 | 3/2012 | Sinha | |
| 2003/0018463 A1* | 1/2003 | Matsuo ............................ | 703/19 |
| 2003/0159124 A1 | 8/2003 | Fisher | |
| 2007/0160323 A1 | 7/2007 | Deliwala | |
| 2009/0281999 A1 | 11/2009 | Sinha | |
| 2009/0292941 A1 | 11/2009 | Ganai et al. | |

OTHER PUBLICATIONS

Geibel, S. et al., "Across the Great Divide," Jasper Design Automation, Inc., Oct. 5, 2009, seven pages. [Online] [Retrieved Mar. 14, 2012] Retrieved from the Internet <URL:http://www.jasper-da.com/press-releases/across-great-divide%E2%80%A6.>.

Jasper Design Automation, Inc., "Jasper Command Reference Manual, Version 6.0," Aug. 2009, pp. 162-163.

(Continued)

*Primary Examiner* — Vuthe Siek
*Assistant Examiner* — Aric Lin
(74) *Attorney, Agent, or Firm* — Vista IP Law Group, LLP

(57) ABSTRACT

The result of a property based formal verification analysis of a circuit design may include at least one counterexample for each property that is violated, which a user can use to debug the circuit design. To assist the user in this debugging process, a debugging tool applies one or more soft constraints to a counterexample trace that simplify the appearance of the trace when displayed as a waveform. The debugging tool thus facilitates a user's understanding of what parts of the counterexample trace are responsible for the property failure. Also described is a power analysis tool that increases the noise level of a trace for a circuit design in order to facilitate analysis of the circuit design's power characteristics.

18 Claims, 5 Drawing Sheets

(56) References Cited

OTHER PUBLICATIONS

U.S. Appl. No. 12/132,186, filed Jun. 3, 2008.
U.S. Appl. No. 12/797,467, filed Jun. 9, 2010.
U.S. Appl. No. 12/797,468, filed Jun. 9, 2010.
U.S. Appl. No. 12/797,471, filed Jun. 9, 2010.
U.S. Appl. No. 12/797,473, filed Jun. 9, 2010.
U.S. Appl. No. 12/797,476, filed Jun. 9, 2010.

* cited by examiner

CONSTRAINING TRACES IN FORMAL VERIFICATION

BACKGROUND

This invention relates generally to formal verification of circuit designs, and more particularly to constraining of traces found in formal verification.

As the complexity in circuit design has increased, there has been a corresponding improvement in various kinds of verification and debugging techniques. In fact, these verification and debugging techniques have evolved from relatively simple transistor circuit-level simulation (in the early 1970s) to logic gate-level simulation (in the late 1980s) to the current art that uses Register Transfer Language (RTL)-level simulation, and formal verification. RTL describes the registers of a computer or digital electronic system and the way in which data are transferred among the combinational logic between registers.

Existing verification and debugging tools are used in the design flow of a circuit. The design flow begins with the creation of a circuit design at the RTL level using RTL source code. The RTL source code is specified according to a Hardware Description Language (HDL), such as Verilog HDL or VHDL. Circuit designers use high-level hardware description languages because of the size and complexity of modern integrated circuits. Circuit designs are developed in a high-level language using computer-implemented software applications, which enable a user to use text-editing and graphical tools to create a HDL-based design.

An increasingly popular technique is to use formal methods to verify the properties of a design completely. Formal methods use mathematical techniques to prove that a design property is either always true or to provide an example condition (called a counterexample) that demonstrates the property is false. Tools that use formal methods to verify RTL source code and design properties are known as "model checkers." Design properties to be verified include specifications and/or requirements that must be satisfied by the circuit design. The formal verification technology requires that the requirements are expressed in a formal notation, for example a temporal language, which enables an exhaustive mathematical check for whether a design complies with the requirements.

Although a counterexample demonstrates an example condition under which a circuit design fails a property, the cause of the failure is not always obvious. Accordingly, what are needed are techniques to view and analyze the results of formal verification of a circuit design (such as a counterexample) to help circuit designers understand the results obtained from the formal verification (e.g., why a particular property failed).

SUMMARY

The result of a property-based formal verification analysis of a circuit design may include at least one counterexample trace for each property that is violated. A user can study the counterexample trace to understand why the property failed and then debug the circuit design. To assist the user in this debugging process, embodiments of the invention include a debugging tool that constrains the counterexample trace to simplify its appearance when displayed as a waveform. In this way, the debugging tool facilitates understanding of what parts of the counterexample trace are responsible for the property failure and what parts are irrelevant.

Embodiments of the invention include a debugging tool that helps the circuit designer better understand counterexamples, and thereby more easily debug the circuit design when counterexamples are found. In one embodiment, for a counterexample identified during the formal verification process, the debugging tool applies one or more soft constraints to the counterexample. The soft constraints define preferences to be satisfied by the counterexample trace, subject to the condition that the trace must still violate the property. For example, a soft constraint can express a preference for signals in the trace to be logic zero for as many signal-cycle pairs as possible, which creates a "quieter" trace. An updated trace is then displayed to the circuit designer, who then uses the updated trace to debug the circuit design.

The debugging tool may also include additional interactive features that help the designer debug the circuit design. In one embodiment, the circuit designer can select a portion of the circuit design, such as particular signal and/or particular cycles of a waveform, and apply soft constraints to the selected portion of the circuit design. In another embodiment, the circuit designer can prioritize circuit designs so that higher priority soft constraints are satisfied before lower priority soft constraints. Additionally, the circuit designer can view a partially updated counterexample trace even before the debugging tool finishes applying the soft constraints.

In other embodiments, the debugging tool need not be limited to analysis of counterexamples obtained from formal verification. For example, embodiments of the techniques described herein may apply to traces that are produced in a simulation of a circuit design in which a property fails on the trace. Accordingly, the invention need not be restricted to formal verification.

Another embodiment includes a power analysis tool for analyzing the power consumption of a circuit design. The power analysis tool receives a trace that illustrates some behavior of the circuit design. The tool applies a soft constraint to the trace to generate an updated trace, where the soft constraint defines a preference for a trace with signal transitions. The updated trace is then used to estimate the power consumption of the circuit design.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Tool Flow and Methodology for Formal Verification

Figure 1:
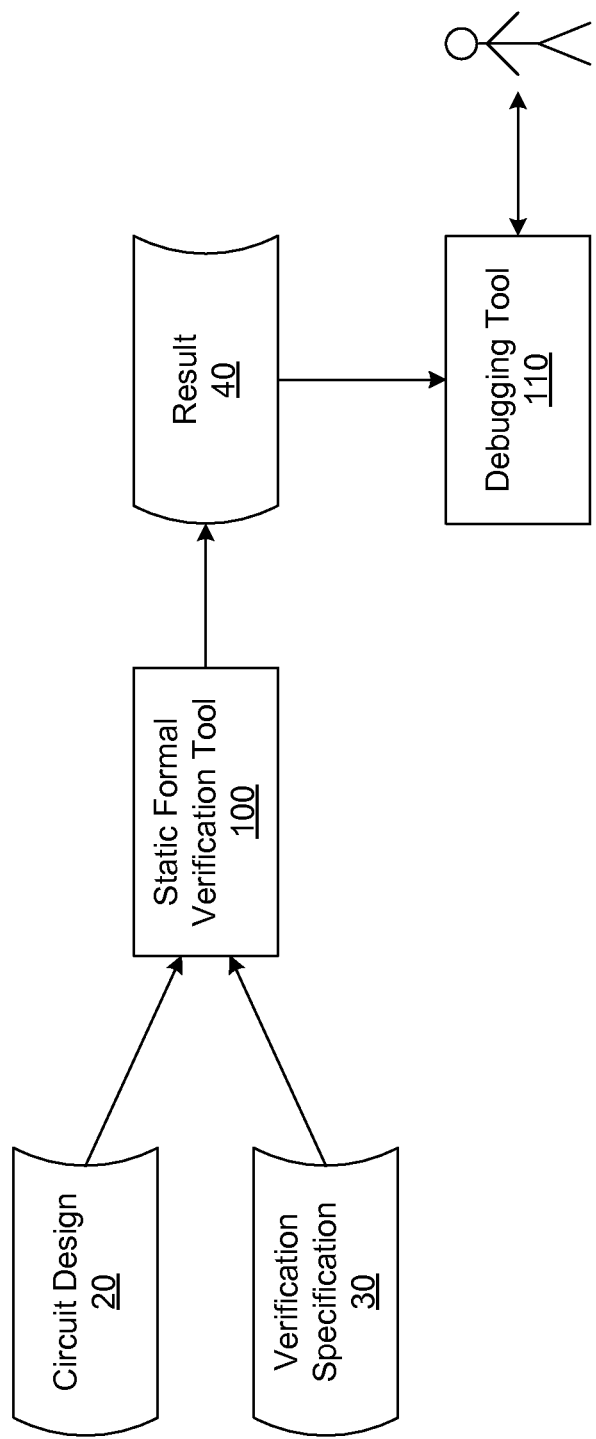
FIG. 1 is a diagram of a verification methodology in accordance with an embodiment of the invention.

FIG. 1 illustrates an embodiment of a methodology for formal verification of a circuit design 20. The circuit design 20 may be embodied in a data file encoded using a hardware description language (HDL), which may describe the structural design and operation of a circuit. A set of requirements is derived from a design specification for the circuit and then used to test whether the circuit design is compliant with the design specification. A user, such as a circuit designer or a verification engineer, may supply the requirements for the circuit design. The requirements may be encoded in a verification specification 30 as one or more properties and/or assumptions for the circuit design 20, encoded for example using Property Specification Language (PSL) or SystemVerilog Assertion (SVA). The verification specification 30 may be directly coded by a user or captured in an automated process. A property may be represented in the verification specification 30 as an assertion, where the assertion is satisfied if the property is true for all operating conditions of the circuit design 20. A property may also be represented in the verification specification 30 as a cover, where the cover is satisfied if the property is true for some operating condition of the circuit design 20. An assumption specifies that certain input signals to the circuit design may only take on predetermined values (i.e., 0 or 1) at certain clock cycles when testing the circuit design against the property.

In a formal verification process, the verification tool 100 receives a circuit design 20 and a verification specification 30 for testing the circuit design 20 against a set of requirements. The circuit design 20 and verification specification 30 may be represented in one or more files containing HDL code, which define a digital design and/or properties that give a functional specification of the design. The verification tool 100 may convert the inputs (i.e., the circuit design 20 and verification specification 30) into an internal representation using one or more data structures, such as a netlist. This conversion may comprise two different conversions: (1) synthesis of the input circuit design 20, and (2) property compilation of the properties in the verification specification 30.

The results of the design synthesis and the property compilation are then combined into a common problem instance that is given as input to a model checker in the verification tool 100. The verification tool 100 then performs formal verification on the circuit design 20 using the statically allocated data structure. For assertions, during the formal verification process, the model checker attempts to determine whether there is a possible behavior of the circuit design 20 where one of the properties in the verification specification 30 are not true, which is called a counterexample for the property. If it is determined that no counterexample exists for a property, the property is said to be proven. The results 40 of the formal verification process thus comprise an indication of whether one or more of the properties are satisfied, and if not, the counterexample showing a condition under which the property fails. The counterexample includes a sequence of values for signals (input, internal, or output) of the circuit design over a number of clock cycles that satisfy the given assumptions but result in the property failure.

The verification of a cover may proceed in a similar way. In one embodiment, for a cover, the verification tool attempts to determine whether there is a possible behavior of the circuit design that satisfies the cover, which is called a cover trace. This cover trace includes a sequence of values for signals of the circuit design over a number of clock cycles that satisfy the given assumption and satisfy the cover.

The verification tool 100 outputs the result 30 of the verification process, which may be stored in memory, passed along to another software process, or displayed to the user. The result may comprise a counterexample if the circuit design 20 fails to meet the properties encoded in the verification specification or a witness if the design 20 satisfies the properties (e.g., the witness can be a cover trace). A debugging tool 110 may also be included to display the counterexample or witness to a circuit designer in a useful way to the designer. In one embodiment, the debugging tool 110 accepts the circuit design 20, verification specification 30, and result 40 as inputs and applies one or more soft constraints to the result 40 to create a quieter trace. This can facilitate understanding of what aspect of the HDL code in the circuit design 20 is responsible for the counterexample to the property in question. The debugging tool 110 may include a viewer as well as editing software.

Debugging Tool

Figure 2:
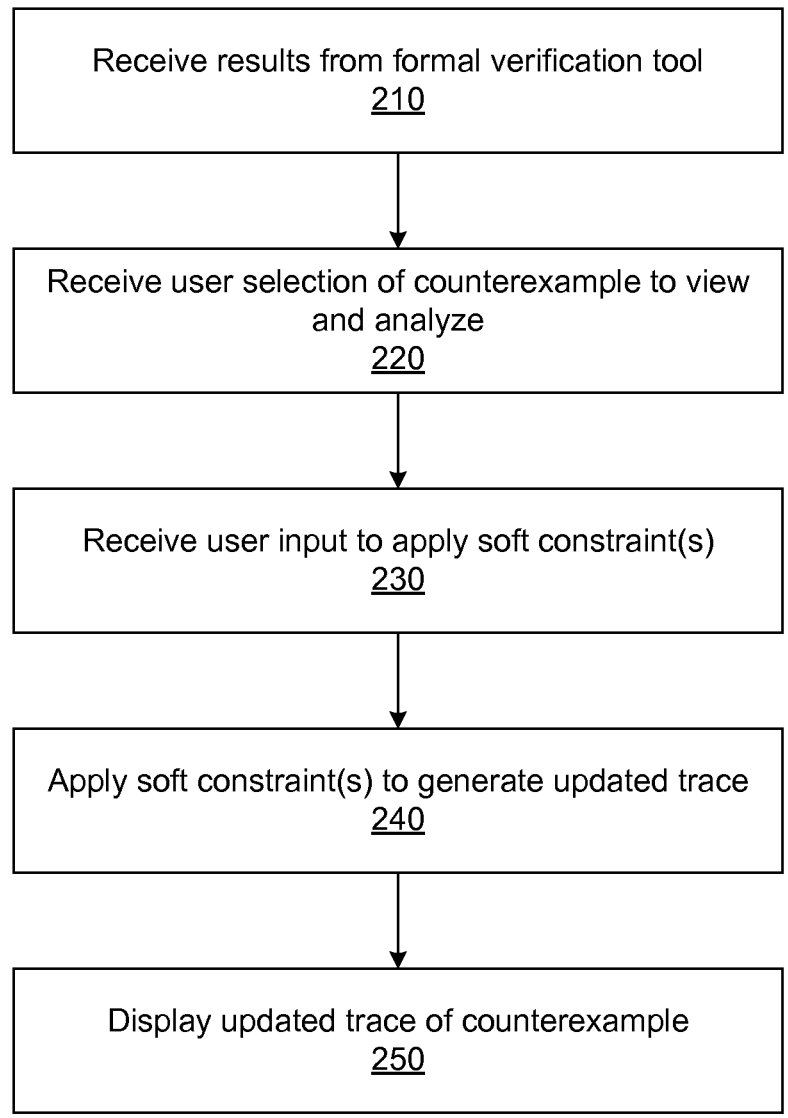
FIG. 2 is a flow chart of an operation of a debugging tool, in accordance with an embodiment of the invention.

Embodiments of the invention provide a debugging tool 110 that helps the circuit designer understand counterexamples that are identified during a formal verification process, and thereby more easily debug the circuit design when counterexamples are found. An example operation of the debugging tool 110 is shown in FIG. 2, which can be performed for any counterexample identified during the formal verification process. The debugging tool 110 first receives 210 the results from the verification tool 100 and presents them to the user. In other embodiments, the results are received 210 from a source other than the verification tool 100. The user may choose a counterexample to analyze, and the debugging tool 110 receives 220 this user selection of which counterexample to analyze. The debugging tool 110 may also present a trace of the counterexample to the user by displaying the individual signals of the counterexample in a waveform over a finite number of clock cycles.

The debugging tool 110 then receives 230 a user input instructing the debugging tool 110 to apply one or more soft constraints. A soft constraint is a preference that the counterexample should satisfy if possible, but does not necessarily need to satisfy. In one embodiment, soft constraints help in debugging a counterexample by suppressing irrelevant aspects of the trace that do not contribute to the violation of the property, thereby simplifying the appearance of the trace when displayed as a waveform. Example soft constraints include a preference for setting the value of all input signals to the circuit design to logic 0 or setting the value of all input signals to logic 1, subject to the condition that changing the value does not affect the property violation. Another type of soft constraint is a preference for reducing the overall activity (i.e., number of signal transitions) of signals in the counterexample regardless of whether the signal values should be set to logic 0 or logic 1, subject to the condition that changing the value does not affect the property violation. Constraints can also be defined to apply to input signals, internal design signals, arbitrary HDL expressions, and temporal SVA expressions.

Soft constraints are in contrast to hard constraints. Soft constraints are conditional preferences that do not necessarily need to be satisfied by the counterexample trace. For example, a constraint of "set signal A to 1 only if property P is still violated" is a soft constraint. By contrast, hard constraints are strict requirements that must satisfied by the counterexample trace. For example, a constraint of "set signal A to 1" has no limitations and is a hard constraint. The circuit design and its assumptions are the primary source of hard constraints because they define strict requirements that cannot be avoided.

In one embodiment, the user input comprises a user input that identifies one or more soft constraints for the debugging tool 110 to apply. For example, the user input may select a specific soft constraint from a list of soft constraints presented to the user. As another example, the user may enter a logical expression that defines a soft constraint, which is then received by the debugging tool 110 as a user input. In another embodiment, the debugging tool 110 is configured to apply a default soft constraint, and the user input triggers the application of the default soft constraint.

The debugging tool 110 then applies 240 the soft constraints to the counterexample trace to generate an updated trace. Some soft constraints may be applied to all signals and all clock cycles in the counterexample, whereas other soft constraints may be applied to only a sub-set of the signals, clock cycles, or signal-cycle pairs. In one embodiment, a user marks certain signals or clock cycles as active, which is received by the debugging tool 110 as a user input. The debugging tool 110 applies 240 the soft constraints only to the portions of the trace marked as active. The active portion of the trace may also be set according to a default configuration (e.g., all cycles active) when there is no user input specifying how the soft constraints should be applied.

In one embodiment, the debugging tool 110 applies 240 the soft constraints to as many signal-cycle pairs as possible within the active portion of the trace. Each signal-cycle pair is considered to be independent of the other signal-cycle pairs. In other words, a soft constraint can be satisfied for a signal-cycle pair regardless of whether the soft constraint can be satisfied for another signal-cycle pair on the same signal. For example, if clock cycle 1 of a signal A cannot satisfy a soft constraint, the debugging tool will still attempt to satisfy the soft constraint for clock cycle 2 of signal A. The application of soft constraints effectively removes aspects of the trace that do not contribute to the violation of the property, resulting in a trace that appears "quieter" and is easier to use in debugging the circuit design. Embodiments for applying 240 soft constraints are described below in conjunction with FIGS. 4A and 4B.

In one embodiment, the debugging tool 110 applies 240 multiple soft constraints to the trace. When multiple soft constraints are involved, the soft constraints are prioritized. Higher priority constraints are generally satisfied at the expense of the lower priority constraints. As such, the debugging tool 110 only satisfies lower priority constraints if it does not result in the violation of a higher priority constraint. The priority for the soft constraints may be set according to a pre-determined configuration or set according to a user input defining the priority order.

After application of the soft constraints, the debugging tool 110 displays 250 a waveform of the updated counterexample trace to a user of the debugging tool 110. In one embodiment, rather than displaying just the updated counterexample trace, the updated counterexample trace is displayed simultaneously with the original counterexample trace. This helps the circuit designer to understand of how the trace has changed as a result of applying the soft constraints. For example, a waveform for the updated counterexample may be displayed side-by-side with or overlaid on top of a waveform for the original counterexample. In another embodiment, a waveform of the updated counterexample is displayed along with markings on the waveform at specific signal-cycle pairs to indicate how the counterexample has changed as a result of applying the soft constraints.

In another embodiment, the debugging tool 110 displays 250 a waveform for a partially updated trace before the debugging tool 110 finishes applying 240 the soft constraints. Applying 240 soft constraints can take a lengthy amount of time to complete, depending on the size and complexity of the circuit design, assumptions, properties, and soft-constraints. To increase the usability of the debugging tool 110 in these situations, the debugging tool 110 may display a waveform of a partially updated counterexample while the trace that best satisfies the soft constraints is being identified by the debugging tool 110. The partially updated counterexample may be displayed automatically according to a pre-defined configuration (e.g., whenever results are available) or in response to a user input requesting that it be displayed.

In a further embodiment, after the updated trace 250 is displayed, the debugging tool 110 allows the user to apply new soft or hard constraints to the updated counterexample trace, thereby generating a sequence of counterexample traces. To maintain similarity with the current trace, the current trace may be used as a soft constraint in determining the next trace. This creates a preference for similarity with the current trace, subject to the condition that the property is still violated. The debugging tool 110 thus attempts to make the next trace as similar as possible to current trace when applying the new constraint. For example, if the new constraint is a hard constraint, the resulting waveform highlights the forced changes caused by the hard constraint while reducing unnecessary changes to other signal-cycle pairs. As another example, if the new constraint is a soft constraint, the new constraint can be given a high priority while the soft constraint that prefers similarity with the current trace is given a lower priority.

The debugging tool 110 also enables the user to jump between the traces in the sequence to compare differences between the traces. For example, the debugging tool 110 receives a user input selecting a trace for display. In response, the debugging tool 110 displays a waveform of the selected trace to the user. This enables the circuit designer to visualize how the trace changes on an incremental basis as new constraints are applied to the trace, which facilitates the process of debugging a circuit design.

Figure 3A:
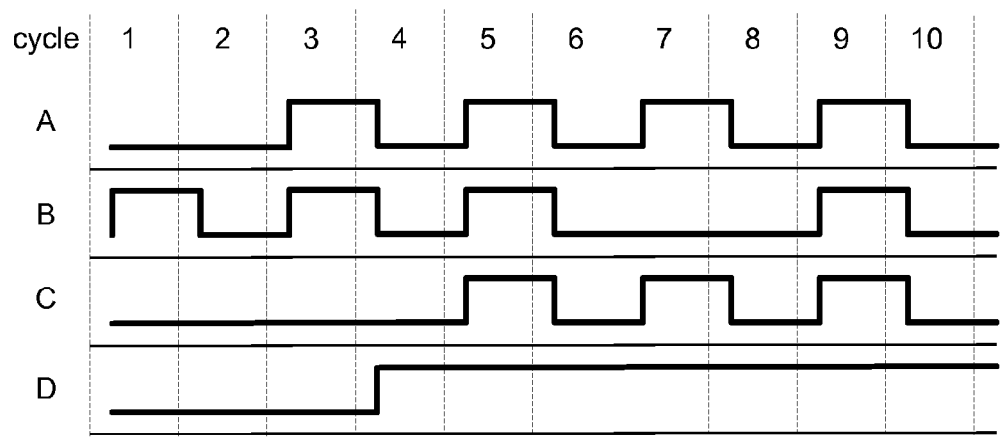
FIGS. 3A-3B are examples of traces before and after soft constraints are applied, which may be displayed by embodiments of the debugging tool.

FIG. 3A illustrates a display of a waveform of a counterexample before soft constraints are applied, according to an embodiment. As shown, this is a waveform of a counterexample trace with four signals, signals A, B, C, and D, that are input signals of a circuit design. The example counterexample trace violates some property P (not shown). The length of the counterexample trace is ten clock cycles. Signal A has eight signal transitions, signal B has eight signal transitions, signal C has six signal transitions, and signal D has one signal transition. The waveform is fairly noisy and has a total of 23 signal transitions. From a circuit designer's perspective, the waveform could be considered difficult to debug because of the high amount of activity occurring in the waveform. Thus, a designer might prefer the waveform to appear quieter and with fewer signal transitions.

Figure 3B:
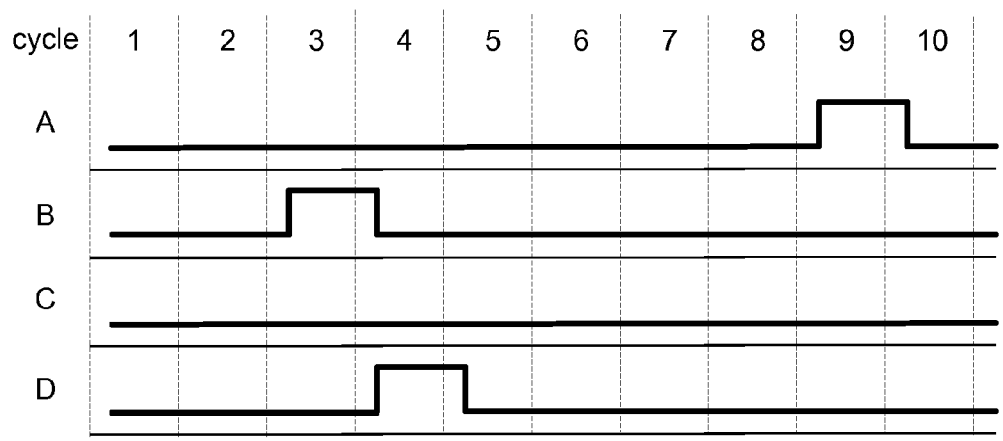

FIG. 3B illustrates an interface for displaying the waveform of FIG. 3A after soft constraints are applied, according to an embodiment. In this example the applied soft constraint attempts to force all signal-cycle pairs to logic 0, subject to the condition that the resulting trace must still violate the property P. As shown, the resulting waveform is much quieter than the waveform in FIG. 3A and is thus easier to understand. Signals A, B, and D now have two signal transitions, and signal C has zero signal transitions. Additionally, by suppressing unnecessary activity, the quieted trace helps to highlight signal/cycle pairs that necessarily contribute to the violation of the property. For example, signal-cycle pairs A-9, B-3, and D-4 must contribute to the violation of the property P because they were not able to satisfy the applied soft constraint.

Use Model

In one embodiment, a user uses the debugging tool 110 to view and analyze counterexamples found in formal verification. The debugging tool 110 obtains the results from a formal verification tool 100 and selects a disproved property (i.e., a property for which the formal verification tool found a counterexample). The debugging tool 110 displays a plot window showing a waveform with the signals in the counterexample.

The user then selects one or more soft constraints to apply to the counterexample. The user may also select from other options presented in the plot window, such as selecting certain clock cycles to apply the constraints to and selecting priority for different soft constraints. The debugging tool 110 applies the soft constraints to the counterexample and displays a waveform of the updated counterexample to the user. In this way, the user can view and analyze the counterexamples found during formal verification to understand the counterexamples better and thus debug the errors in the circuit design leading to the violation of the property.

In one embodiment, the functionality described as being in the debugging tool 110 is integrated into the formal verification tool 100. Thus, soft constraints may be applied by the formal verification tool 100 when generating a counterexample during formal verification. In such an embodiment, the user may select the soft constraints before formal verification begins, or the formal verification tool 100 may apply a default set of soft constraints during formal verification in order to quiet the results.

Applying Soft Constraints

Described herein is one embodiment for applying 240 soft constraints in the debugging tool 110. The debugging tool 110 uses the length of a counterexample trace (e.g., number of clock cycles in a trace), a circuit design, assumptions used by the trace, property failed by the trace, and soft constraints in determining the trace that best satisfies the soft constraints (the "optimal trace"). The debugging tool 110 synthesizes the circuit design into a mathematical model of the circuit design of the type that is commonly used in formal verification. For example, the debugging tool may use a Satisfiability (SAT) algorithm to unfold the logic of the circuit design over the length of the counterexample trace. The SAT model includes variables that represent the values of signal/cycle pairs in the circuit design. As another example, the model could be a Binary Decision Diagram. Signal-cycle pairs in the trace that should not be changed, such as those affected by assumptions, are marked as being frozen. Other signal-cycle pairs are left unfrozen so that the debugging tool 110 can optimize their values when applying 240 the soft constraints. The debugging tool 110 then iteratively tests the mathematical model with different inputs to identify a trace that best satisfies the soft constraints while still complying with the assumptions.

Figure 4A:
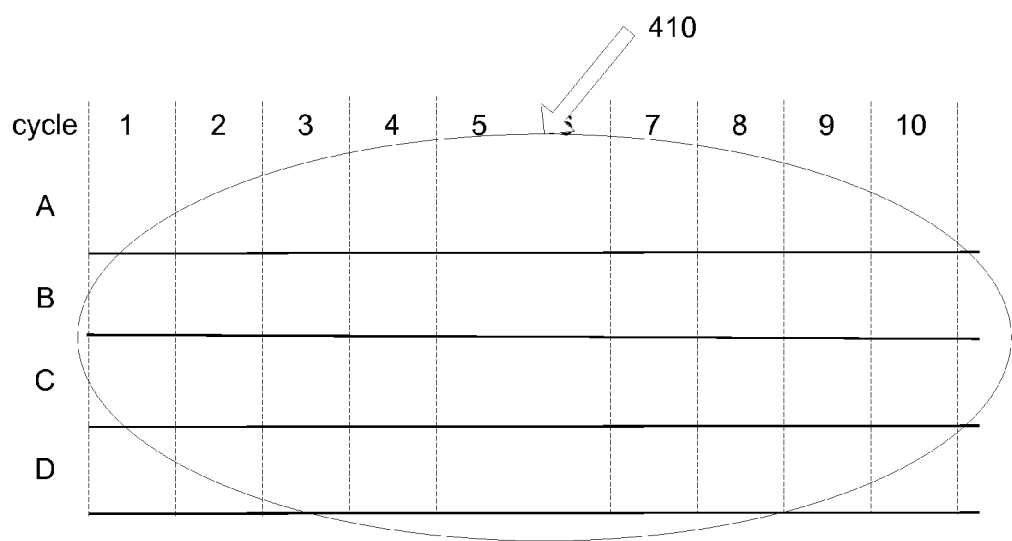
FIG. 4A-4B illustrate applying a soft constraint in accordance with an embodiment of the invention.
Figure 4B:
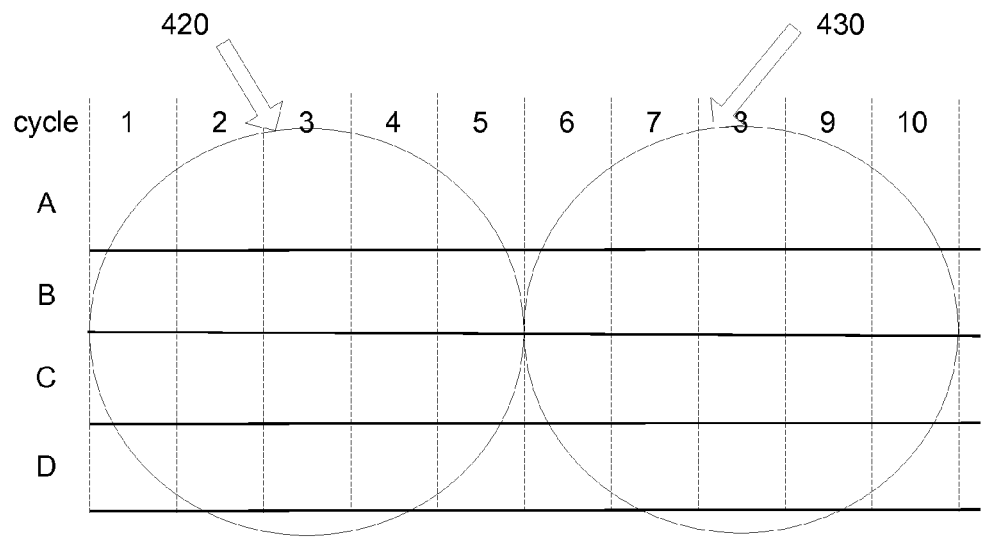

FIGS. 4A and 4B illustrate applying 240 a soft constraint, in accordance with an embodiment of the invention. In one embodiment, the debugging tool applies 240 a soft constraint to large groups of signal-cycle pairs to identify the trace that best satisfies the soft constraint (the "optimal trace"). Applying 240 soft constraints to large groups of signal-cycle pairs is beneficial for reducing the overall processing time needed to identify the optimal trace. In one embodiment, applying 240 soft constraints in this manner proceeds as follows. Initially, all the unfrozen signal-cycle pairs in the trace are placed into a single group 410 (assume here there are no frozen signal-cycle pairs). Each signal-cycle pair in the group is assigned a value preferred by the soft constraint. The circuit design is tested against the property using the updated trace that includes these assigned values. If the property is violated with this trace, the soft constraint is satisfied and the optimal trace has been identified.

However, if the property is not violated, the group 410 is broken down into sub-groups, such as sub-group 420 and 430. The soft-constraint is separately applied to each sub-group to determine if that sub-group, as a whole, can satisfy the soft-constraint. For example, signal-cycle pairs in group 420 can be assigned to values that are preferred by the soft-constraint. The circuit design is then tested against the property using the assigned values for group 420 in an attempt to identify a trace that violates the property. If a trace that violates the property can be identified, the assigned values for sub-group 420 can satisfy the soft-constraint and these values are retained for testing sub-group 430. Additionally, this trace can also be output as a best-so-far trace (i.e. partially updated trace) while the complete optimal trace is still being identified. If a sub-group 420 430 cannot satisfy the soft-constraint, the sub-group 420 430 is further divided into smaller sub-groups for application of the soft-constraint until division is no longer possible (e.g., if the sub-group contains only one signal-cycle pair).

It should be noted that the forgoing technique is just one example for applying 240 soft constraints; it is not intended to be exhaustive or to limit the invention to this example. In other embodiments, other methods of applying 240 soft constraints are possible.

Power Analysis

In a further embodiment, soft constraints can be used not only to debug counterexamples in a circuit design, but also to facilitate power analysis of a circuit design. Traces generated during a verification or simulation are typically designed to check for functional correctness of a circuit design, and are not designed to stress the circuit design from a power standpoint. Circuit designs typically consume more power when the signals (input or internal) of the circuit design are switching at a high frequency. To help analyze the power consumption or power characteristics of a circuit design, it is thus desirable to have a trace that is noisy (i.e., has a high number of signal transitions).

Figure 5:
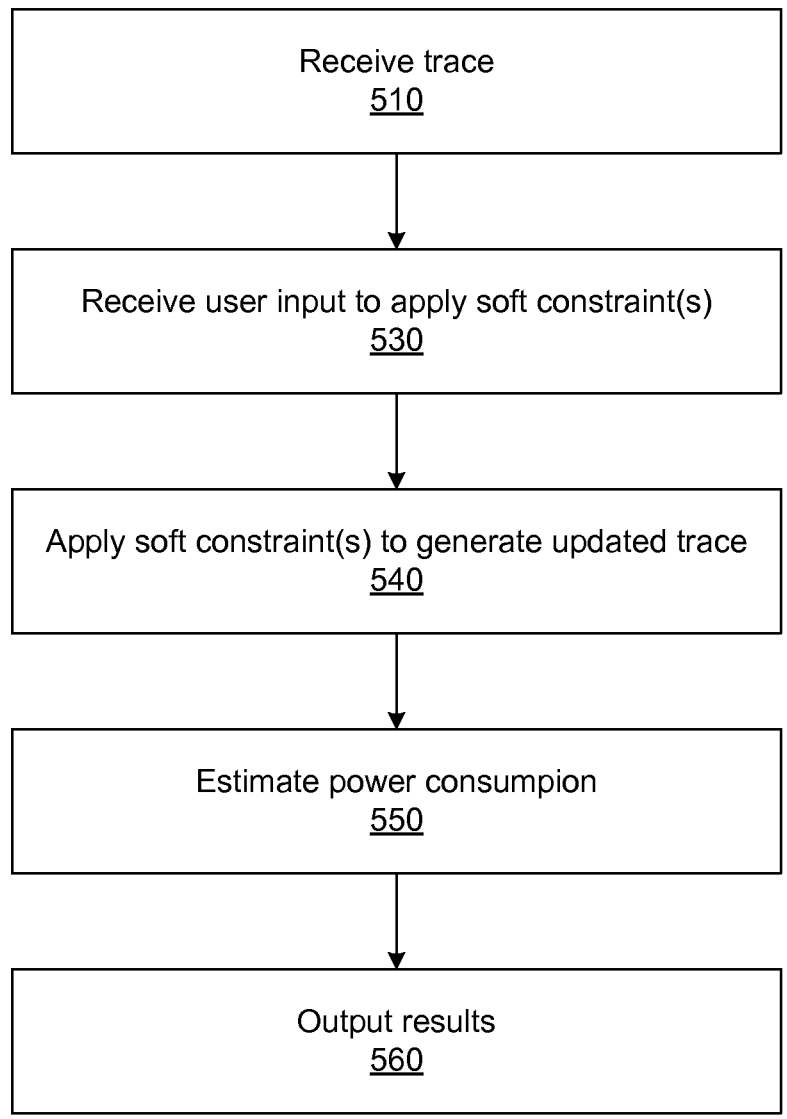
FIG. 5 is a flow chart of an operation of a power analysis tool, in accordance with an embodiment of the invention.

FIG. 5 illustrates a method of applying soft constraints for power analysis according to one embodiment. In one embodiment, the method is performed by a power analysis tool, which is similar to the debugging tool 100 described in FIG. 2. Thus, many of the principles described in conjunction with FIG. 2 also apply to the power analysis tool.

Initially, the power analysis tool receives 510 a trace of signals for a circuit design. In one embodiment, the trace is a cover trace that satisfies a cover property defined for the circuit design. In one embodiment, the trace is received from the verification tool 100. Alternatively, the trace is received from a source other than the verification tool 100, such as from a location stored in memory or from a simulation of the circuit design.

The power analysis tool then receives 530 a user input to apply a soft constraint. A soft constraint defines a preference that should be satisfied by the trace. For purposes of power estimation, the soft constraint may be a preference for a trace that has a high number of signal transitions (0 to 1 and 1 to 0) so that a noisier trace can be generated. For example, a soft constraint may be a preference for signal transitions in the trace, subject to the condition that a cover property is still satisfied by the updated trace.

The power analysis tool then applies 540 the soft constraint to generate an updated trace. In one embodiment, the power analysis tool applies 540 the soft constraint by repeatedly testing different input sequences against a mathematical model of the circuit design until the optimal trace is identified. For example, the optimal trace may be the trace with a higher or highest number of signal transitions that still obeys any hard constraints (e.g., assumptions, etc) and satisfies the cover property. Similar to the debugging tool 100, the soft constraints may be applied only to a subset of signals (e.g., input, internal, output, etc) or clock cycles. The result is a noisier trace with more signal transitions that causes the circuit design to draw a higher amount of power.

The power analysis tool then estimates 550 the power consumption of the circuit design based on the updated trace. In one embodiment, the power analysis tool determines a signal activity factor, which can be the number of signal transitions in the updated trace. The signal activity factor is input into a power equation that considers one or more other factors such as the clock speed of the circuit design, number of transistors in the circuit design, and various silicon technology parameters. Using the power equation, an estimated power consumption is computed for the circuit design.

The power analysis tool then outputs 560 results. Outputting results may comprise outputting the estimated power consumption to a display or to a storage location. For example, the estimated power consumption may be shown on a display screen to a user of the power analysis tool. Outputting results may also comprise outputting the updated trace to a display or storage location. Further, outputting results may comprise any combination of outputting the estimated power consumption and the updated trace.

SUMMARY

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a non-transitory computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium or any type of media suitable for storing electronic instructions, and coupled to a computer system bus. Furthermore, any computing systems referred to in the specification may include a single processor or may be architectures employing multiple processor designs for increased computing capability.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A computer program product for constraining counterexamples, the computer program product comprising a non-transitory computer-readable storage medium containing computer program code for:
   receiving a counterexample trace comprising a plurality of signals of a circuit design, the counterexample trace illustrating a behavior of the circuit design that violates a property defined for the circuit design;
   applying one or more soft constraints to generate an updated counterexample trace, the soft constraints defining preferences to be satisfied by the updated counterexample trace, wherein applying the one or more soft constraints comprises:
      applying the one or more soft constraints to a first plurality of signal-cycle pairs of a signal;
      determining whether applying the one or more soft constraints to the first plurality of signal-cycle pairs of the signal still results in violation of the property; and
      responsive to determining that the property is not still violated, applying the one or more soft constraints to a second plurality of the signal-cycle pairs of the signal that is a sub-set of the first plurality of the signal-cycle pairs; and
   displaying the updated counterexample trace.

2. The computer program product of claim 1, wherein the counterexample trace is for a counterexample identified for the circuit design and received from a formal verification process performed on the circuit design.

3. The computer program product of claim 1, wherein the property is an assertion.

4. The computer program product of claim 1, wherein applying the soft constraints comprises applying the soft constraints responsive to a user input requesting that soft constraints be applied.

5. The computer program product of claim 1, wherein at least one of the soft constraint comprises a preference for one of setting signal values to logic zero and setting signal values to logic one.

6. The computer program product of claim 1, wherein at least one of the soft constraint comprises a preference for no signal transitions.

7. The computer program product of claim 1, wherein at least one of the soft constraints comprises a preference for no signal transitions, setting signal values to logic zero, and setting signal values to logic one.

8. The computer program product of claim 1, wherein the one or more soft constraints comprise a plurality of soft constraints that are prioritized from highest priority to lowest priority.

9. The computer program product of claim 1, the storage medium further comprising additional computer program code for receiving a user input selecting an active portion of the counterexample trace, and wherein applying the one or more soft constraints comprises applying the soft constraints only to the active portion of the counterexample trace.

10. The computer program product of claim 1, wherein displaying the updated counterexample trace comprises displaying a partially updated counterexample trace while the soft constraints are being applied.

11. The computer program product of claim 1, wherein displaying the updated counterexample trace comprises displaying the updated counterexample trace simultaneously with the received counterexample trace.

12. The computer program product of claim 1, wherein displaying the updated counterexample trace comprises displaying a waveform of signals in the updated counterexample trace.

13. A computer implemented method for constraining counterexamples, the method comprising:
  receiving a counterexample trace comprising a plurality of signals of a circuit design, the counterexample trace illustrating a behavior of the circuit design that violates a property defined for the circuit design;
  applying, by a computer, one or more soft constraints to generate an updated counterexample trace, the soft constraints defining preferences to be satisfied by the updated counterexample trace, wherein applying the one or more soft constraints comprises:
  applying the one or more soft constraints to a first plurality of signal-cycle pairs of a signal;
  determining whether applying the one or more soft constraints to the first plurality of signal-cycle pairs of the signal still results in violation of the property; and
  responsive to determining that the property is not still violated, applying the one or more soft constraints to a second plurality of the signal-cycle pairs of the signal that is a sub-set of the first plurality of the signal-cycle pairs; and
  displaying the updated counterexample trace.

14. The method of claim 13, wherein at least one of the soft constraints comprises a preference for one of setting signal values to logic zero and setting signal values to logic one.

15. The method of claim 13, wherein at least one of the soft constraints comprises a preference for no signal transitions.

16. The method of claim 13, further comprising receiving a user input selecting an active portion of the counterexample trace, and wherein applying the one or more soft constraints comprises applying the soft constraints only to the active portion of the counterexample trace.

17. The method of claim 13, wherein displaying the updated counterexample trace comprises displaying a partially updated counterexample trace while the soft constraints are being applied.

18. The method of claim 13, wherein displaying the updated counterexample trace comprises displaying the updated counterexample trace simultaneously with the received counterexample trace.

* * * * *